(12) United States Patent
Gu et al.

(10) Patent No.: US 11,101,224 B2
(45) Date of Patent: Aug. 24, 2021

(54) WRAPPED SIGNAL SHIELDING IN A WAFER FANOUT PACKAGE

(71) Applicant: Futurewei Technologies, Inc., Plano, TX (US)

(72) Inventors: Shiqun Gu, San Diego, CA (US); Tiejun Liu, Shenzen (CN); Zhao Chen, Shenzen (CN)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 15/877,283

(22) Filed: Jan. 22, 2018

(65) Prior Publication Data
US 2018/0358303 A1 Dec. 13, 2018

Related U.S. Application Data

(60) Provisional application No. 62/517,018, filed on Jun. 8, 2017.

(51) Int. Cl.
| | |
|---|---|
| *H01L 23/552* | (2006.01) |
| *H01L 23/00* | (2006.01) |
| *H01L 23/522* | (2006.01) |
| *H01L 21/768* | (2006.01) |
| *H01L 23/498* | (2006.01) |

(52) U.S. Cl.
CPC ...... *H01L 23/552* (2013.01); *H01L 21/76802* (2013.01); *H01L 21/76877* (2013.01); *H01L 23/49827* (2013.01); *H01L 23/5226* (2013.01); *H01L 24/14* (2013.01); *H01L 24/17* (2013.01); *H01L 23/49816* (2013.01); *H01L 23/49838* (2013.01); *H01L 2224/04105* (2013.01); *H01L 2224/12105* (2013.01); *H01L 2224/18* (2013.01); *H01L 2924/14* (2013.01); *H01L 2924/15321* (2013.01); *H01L 2924/181* (2013.01); *H01L 2924/18162* (2013.01); *H01L 2924/3025* (2013.01)

(58) Field of Classification Search
CPC ......... H01L 21/76802; H01L 21/76877; H01L 23/498; H01L 23/522; H01L 23/552; H01L 24/14; H01L 24/17; H01L 23/5226; H01L 23/49827; H01L 23/49838; H01L 2224/04105
USPC .......................................................... 257/659
See application file for complete search history.

(56) References Cited

U.S. PATENT DOCUMENTS

| | | | | |
|---|---|---|---|---|
| 7,342,303 | B1 * | 3/2008 | Berry ...................... | H01L 23/29 257/703 |
| 7,629,674 | B1 * | 12/2009 | Foster ..................... | H01L 21/56 257/659 |
| 7,633,765 | B1 * | 12/2009 | Scanlan .................. | H01L 24/18 361/760 |
| 8,199,518 | B1 * | 6/2012 | Chun ...................... | H05K 7/10 361/767 |

(Continued)

*Primary Examiner* — Nitin Parekh
(74) *Attorney, Agent, or Firm* — Vierra Magen Marcus LLP

(57) ABSTRACT

Techniques and structures for improving shielding of an integrated circuit package are provided. The integrated circuit package includes a die including a plurality of bump sites and a substrate connected to the die at the plurality of bump sites. The substrate includes at least one layer that implements one or more signal traces and a plurality of shield traces. Each shield trace in the plurality of shield traces is coupled to a ground plane by a plurality of slot vias.

20 Claims, 12 Drawing Sheets

(56) References Cited

U.S. PATENT DOCUMENTS

| | | | |
|---|---|---|---|
| 9,972,589 B1* | 5/2018 | Goh | H01L 23/66 |
| 2005/0280139 A1* | 12/2005 | Zhao | H01L 23/4334 |
| | | | 257/704 |
| 2014/0071646 A1* | 3/2014 | Qian | H05K 1/0219 |
| | | | 361/777 |
| 2014/0197545 A1* | 7/2014 | Chase | H01L 23/552 |
| | | | 257/774 |

* cited by examiner

WRAPPED SIGNAL SHIELDING IN A WAFER FANOUT PACKAGE

CROSS-REFERENCE TO RELATED APPLICATIONS

This application claims the benefit of U.S. Provisional Application No. 62/517,018, titled "Wrapped Signal Shielding in a Wafer Fanout Package," filed Jun. 8, 2017, the entire contents of which is incorporated herein by reference.

FIELD OF THE INVENTION

The present disclosure relates to integrated circuits, and more particularly to wafer fanout packaging.

BACKGROUND

Wafer fanout packaging technology enables a small die footprint to be interfaced with a larger ball grid array footprint for mounting the integrated circuit package on a printed circuit board. The wafer fanout packaging technology includes a substrate that includes signal traces made of interconnects and vias in one or more redistribution layers. The substrate may also include one or more power planes and bump sites for solder balls.

The signals routed through the substrate are subject to noise based on inductive or capacitive coupling. Dynamic current fluctuations in neighboring signal traces may cause fluctuations in the voltage level of the signal on a particular signal trace. Various steps, such as shielding and creative routing design, have been implemented to try and reduce the noise on the signal traces. Still, improvements to these techniques are needed to more effectively reduce noise and interference.

SUMMARY

Techniques and structures for improving shielding of an integrated circuit package are provided. The integrated circuit package includes a die that further includes a plurality of bump sites and a substrate connected to the die at the plurality of bump sites. The substrate includes at least one layer that implements one or more signal traces and a plurality of shield traces. Each shield trace in the plurality of shield traces is coupled to a ground plane by a plurality of slot vias.

In a first embodiment, each slot via comprises an array of microvias.

In a second embodiment (which may or may not be combined with the first embodiment), each microvia in the array of microvias is created by forming a hole in a dielectric material of the substrate and plating or filling the hole with a conductive material.

In a third embodiment (which may or may not be combined with the first and/or second embodiments), the hole is formed using a laser drilling technique.

In a fourth embodiment (which may or may not be combined with the first, second, and/or third embodiments), each slot via is created by forming an elongated hole or trench open in a dielectric material of the substrate and plating or filling the elongated hole or trench open with a conductive material.

In a fifth embodiment (which may or may not be combined with the first, second, third, and/or fourth embodiments), the elongated hole or trench open is formed using at least one of laser etching, laser chemical etching, plasma etching, metal assisted chemical etching, or a lithography defined polyimide or PBO (Polybenzoazole) pattern.

In a sixth embodiment (which may or may not be combined with the first, second, third, fourth, and/or fifth embodiments), each shield trace in the plurality of shield traces includes an interconnect and an extension in the substrate such that the height of the shield trace is larger than a height of a corresponding signal trace.

In a seventh embodiment (which may or may not be combined with the first, second, third, fourth, fifth, and/or sixth embodiments), the interconnect is wider than the extension.

In an eighth embodiment (which may or may not be combined with the first, second, third, fourth, fifth, sixth, and/or seventh embodiments), each shield trace in the plurality of shield traces is coupled to a second ground plane by a plurality of additional slot vias.

In a ninth embodiment (which may or may not be combined with the first, second, third, fourth, fifth, sixth, seventh, and/or eighth embodiments), the method of manufacturing a substrate capable of being used in an integrated circuit package includes forming a layer that is a ground plane, and forming at least one additional layer that implements one or more signal traces and a plurality of shield traces. Each shield trace in the plurality of shield traces is coupled to the ground plane by a plurality of slot vias.

To this end, in some optional embodiments, one or more of the foregoing features of the aforementioned process, apparatus and/or system may afford an integrated circuit package that, in turn, may improve electrical characteristics of the integrated circuit package, such as by improving the shielding of signal traces in fanout wafer packaging. It should be noted that the aforementioned potential advantages are set forth for illustrative purposes only and should not be construed as limiting in any manner.

DETAILED DESCRIPTION

One solution to improve fan-out wafer level packaging is to add shielding structures inside a substrate utilized for signal fanout. The shielding structures may comprise interconnects on either side of a signal trace. The interconnects are coupled to a ground plane at multiple locations using slotted vias to make the shielding structure more efficient at reducing noise on corresponding signal traces in the substrate. In addition, the shielding structure may be implemented across multiple layers of the substrate such that the shielding structure is taller than the corresponding signal traces it is meant to shield. In effect, the shielding structures, when combined with one or more ground planes, at least partially wrap around a signal trace to protect the signal trace from EM fields generated by current fluctuations or switching in nearby signal traces.

Figure 1A:
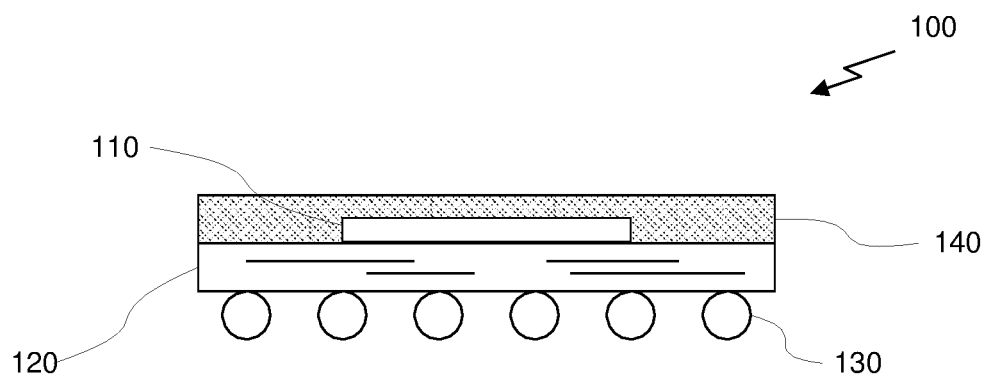
FIGS. 1A & 1B illustrate an integrated circuit package, in accordance with the prior art.
Figure 1B:
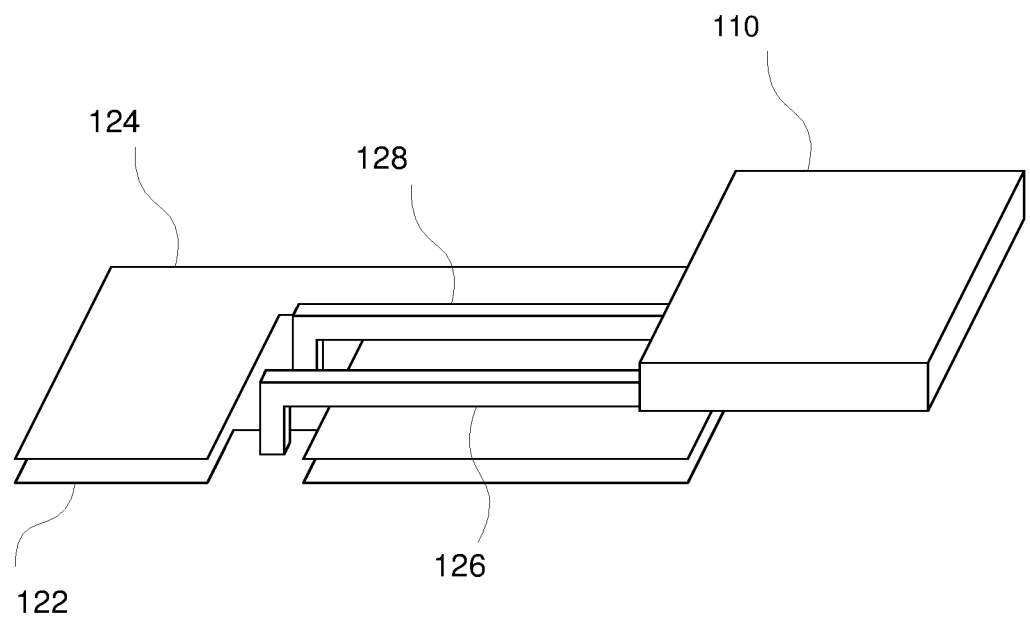

FIGS. 1A & 1B illustrate an integrated circuit package 100, in accordance with the prior art. As shown in FIG. 1A, the package 100 includes a die 110 encapsulated in a molding material 140, a substrate 120, and a plurality of solder balls 130. The die 110 is an integrated circuit manufactured utilizing conventional wafer manufacturing technology. The die 110 is coupled to a substrate 120 that includes a number of redistribution layers that interface the bump sites on the die 110 with solder balls 130 included in a ball grid array (BGA) or other surface mounting technology. The substrate 120 includes a plurality of metallic redistribution layers embedded in a dielectric material. Each redistribution layer may include conductive interconnects (e.g., copper traces) designed to route signals from one location to another location in the substrate 120. Interconnects within different layers of the substrate 120 may be connected across the layers by vias. In addition, one or more power planes may be included within the substrate 120. A power plane may be implemented as a metallic layer connected to a particular power supply voltage (e.g., by connecting the metallic layer to a pad on a bottom layer of the substrate 120 that is coupled to a solder ball 130 connected to a power supply voltage). Voids may be etched in the metallic layer to enable signals to pass from one side of the substrate 120 to the other side of the substrate 120.

The substrate 120 is typically designed with a plurality of layers. A bottom layer includes a plurality of pads at sites for solder balls of the BGA. The next layer is a power plane 122 connected to a positive power supply voltage (e.g., $V_{DD}$). The next layer is a ground plane 124 connected to a negative power supply voltage (e.g., $V_{SS}$). One or more additional redistribution layers are arranged above the ground plane 124. Signals from the BGA are routed up through the power plane 122 and the ground plane 124 and then routed in the one or more additional redistribution layers to a location of a bump site on the die 110 so that the signals are connected to the integrated circuit elements in the die 110.

As shown in FIG. 1B, a first signal trace 126 connects a solder ball 130 of the BGA to a bump site on the die 110 via one or more interconnects and vias in the various redistribution layers of the substrate 120. A second signal trace 128 connects the power plane 122 to one or more bump sites on the die 110 utilized for power distribution, again, via one or more interconnects and vias in the various redistribution layers of the substrate 120. It will be appreciated that a large current may pass through the second signal trace 128 as power is supplied to the die 110. This current may vary at high frequency based on the dynamic power consumption requirements of the die 110 as various transistors in the integrated circuit logic switch on or off. The flow of current can induce noise on the first signal trace 126. Care may be taken to design the substrate 120 to reduce the effects of noise on the various signal traces in the substrate 120. In addition, when a signal switches on the first signal trace 126, the signal changes are coupled to the second signal trace 128.

Figure 1C:
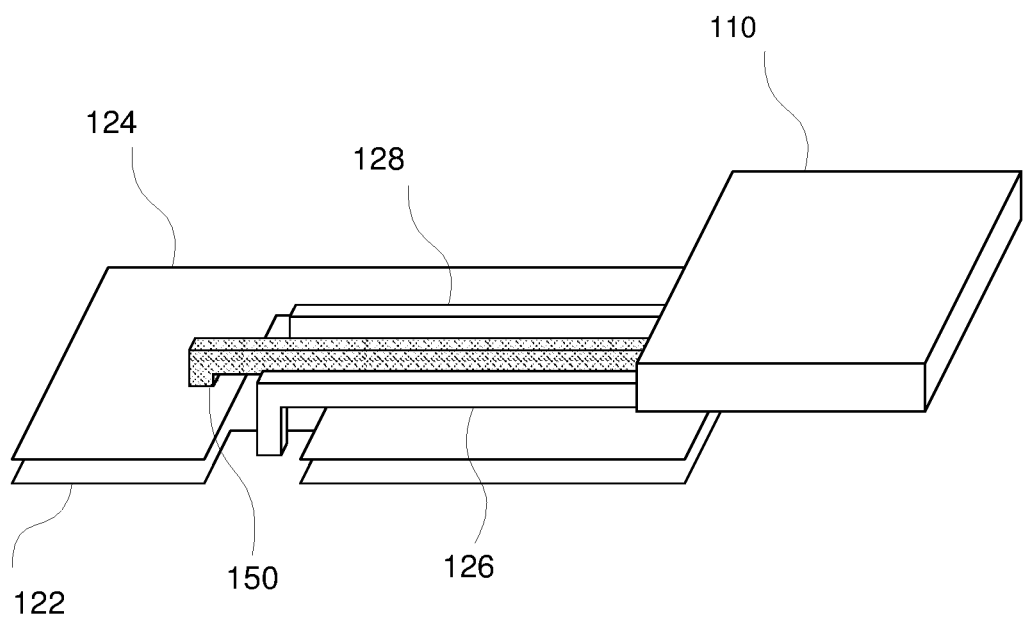
FIG. 1C illustrates one technique for reducing noise on signal traces in the substrate, in accordance with the prior art.

FIG. 1C illustrates one technique for reducing noise on signal traces in the substrate 120, in accordance with the prior art. The noise can be reduced by attempting to implement some form of shielding between the various signal traces. A shield trace 150 may be formed between the first signal trace 126 and the second signal trace 128. The shield trace 150 is simply an interconnect in the redistribution layer that is connected to the ground plane 124, typically by a single via at the end of the shield trace because the via landing pad is much larger than the trace width without the via. The shield trace 150 is the same thickness as the other structures in a particular redistribution layer of the substrate 120. The shield trace 150 does not wrap around the first signal trace 128 and, therefore, the shield trace 150 is not as effective as a shielding agent. Some of the EM field associated with the current flowing through the first signal trace 126 can be coupled to the second signal trace 128 beneath or on top of shield trace 150. Thus, it would be beneficial to design more effective shielding structures within a fanout package such as substrate 120.

Figure 2A:
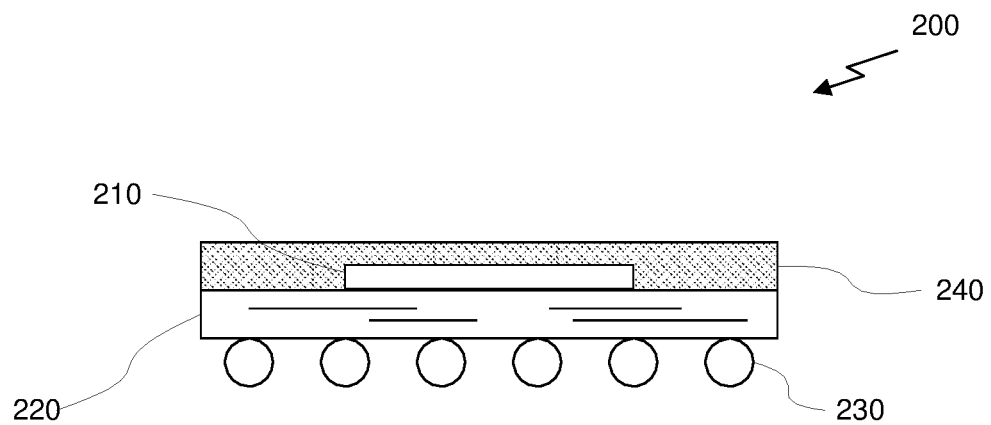
FIGS. 2A & 2B illustrate a technique for reducing noise on signal traces in a substrate, in accordance with one embodiment.
Figure 2B:
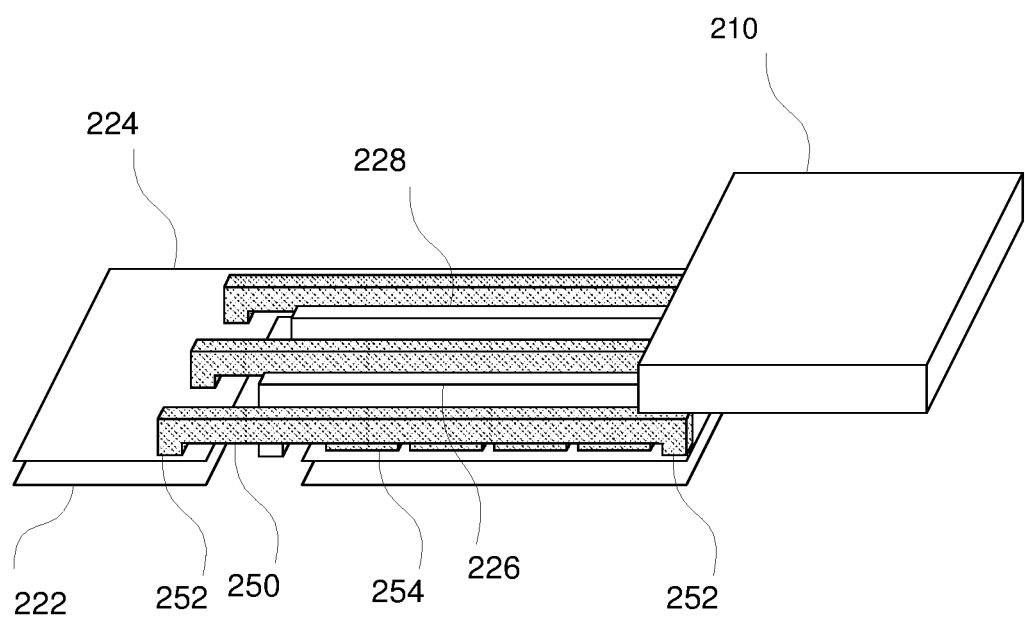

FIGS. 2A & 2B illustrate a technique for reducing noise on signal traces in a substrate 220, in accordance with one embodiment. As shown in FIG. 2A, the package 200 includes a die 210 encapsulated in a molding material 240, a substrate 220, and a plurality of solder balls 230. The die 210 is an integrated circuit manufactured utilizing conventional wafer manufacturing technology. The die 210 is coupled to a substrate 220 that includes a number of redistribution layers that interface the bump sites on the die 210 with solder balls 230 included in a ball grid array (BGA) or other surface mounting technology. The substrate 220 includes a plurality of metallic redistribution layers embedded in a dielectric material. Each redistribution layer may include conductive interconnects (e.g., copper traces) designed to route signals from one location to another location in the substrate 220. Interconnects within different layers of the substrate 220 may be connected across the layers by vias. In addition, one or more power planes may be included within the substrate 220. A power plane may be implemented as a metallic layer connected to a particular power supply voltage (e.g., by connecting the metallic layer to a pad on a bottom layer of the substrate 220 that is coupled to a solder ball 230 connected to a power supply voltage). Voids may be etched in the metallic layer to enable signals to pass from one side of the substrate 220 to the other side of the substrate 220.

The substrate 220 is typically designed with a plurality of layers. A bottom layer includes a plurality of pads at sites for solder balls of the BGA. The next layer is a power plane 222 connected to a positive power supply voltage (e.g., $V_{DD}$). The next layer is a ground plane 224 connected to a negative power supply voltage (e.g., $V_{SS}$). One or more additional redistribution layers are arranged above the ground plane 224. Signals from the BGA are routed up through the power plane 222 and the ground plane 224 and then routed in the one or more additional redistribution layers to a location of a bump site on the die 210 so that the signals are connected to the integrated circuit elements in the die 210. It will be appreciated that the order of the redistribution layers may be changed in various embodiments. For example, the power plane 222 may be located above the ground plane 224, the one or more additional redistribution layers may be located below both the power plane 222 and the ground plane 224, and/or the substrate 220 may include multiple power planes 222 at different supply voltages and/or multiple ground planes 224.

As shown in FIG. 2B, one or more shield trace 250 may be formed in the substrate 220. In one embodiment, a first signal trace 226 is bounded on two sides by a pair of shield traces 250. Each shield trace 250 is different from shield trace 150 because the shield trace 250 is coupled to the ground plane 224 at multiple points. The shield trace 250 may be connected to the ground plane 224 by vias 252 at one or both ends of the shield trace 250. In addition, the shield trace 250 is connected to the ground plane 224 by a plurality of slot vias 254 that, in one embodiment, are regularly spaced.

A slot via 254 may refer to a via that is not formed from a uniform round hole, but is instead formed by an elongated hole or trench open that is elongated in a dimension that is parallel to the length of the shield trace 250. The elongated hole or trench open may be formed by laser etching, laser chemical etching, plasma etching, metal assisted chemical etching, lithography defined polyimide or PBO (Polybenzoazole) pattern, or any other techniques well-known in the art. Once the elongated hole is formed in a dielectric material of the substrate 220, the elongated hole is filled with a conductive material such as copper or copper alloy. In one embodiment, a plurality of slot vias 254 may be formed along the length of the shield trace 250. It will be appreciated that the dimensions given herein are merely examples, and actual implementations of the technique may be applied to structures of different sizes. For example, a signal trace and shield trace may be 10 µm in width and/or thickness and slot vias may be 5-10 µm in width and 10-50 µm in length. The actual dimensions of the given structures may depend on the technology used for manufacturing, a standard width of signal traces, and the like.

In another embodiment, a slot via 252 is implemented as an array of microvias that approximate a monolithic, copper filled slot. For example, a slot via 252 may be implemented by forming a one dimensional array of 10 µm microvias. Thus, an approximate equivalent to a 30 µm slot via 254 may be implemented as an array of 2 microvias. It will be appreciated that the distance between each microvia should be small (e.g., less than a diameter of a microvia) such that the microvias approximate a shielding wall similar to a monolithic, copper filled slot. In one embodiment, the distance between microvias in a slot via 250 may be selected based on a wavelength associated with the operating frequency of the die 210. For example, each 10 µm diameter microvia may be placed 15 µm center to center, such that a three 10 µm microvia array spans 40 µm. The microvias may be drilled, at least in part, via laser drilling techniques. Microvias may be formed by laser chemical etching, plasma etching, metal assisted chemical etching, lithography defined polyimide or PBO pattern, or any other techniques well-known in the art.

The pair of shield traces 250, including vias 252, and slot vias 254, along with the ground plane 224, form a shielding channel on three sides of the first signal trace 226. This increases the noise reducing capability of the shielding implemented within the substrate 220 when compared to shield trace 150. It will be appreciated that a number of shield traces 250 can be implemented within the substrate 220 to shield a large number of signal traces such as the first signal trace 226 and the second signal trace 228. The shielding effectiveness of the shield traces 250 may be improved using a number of techniques, discussed in more detail below.

Figure 3:
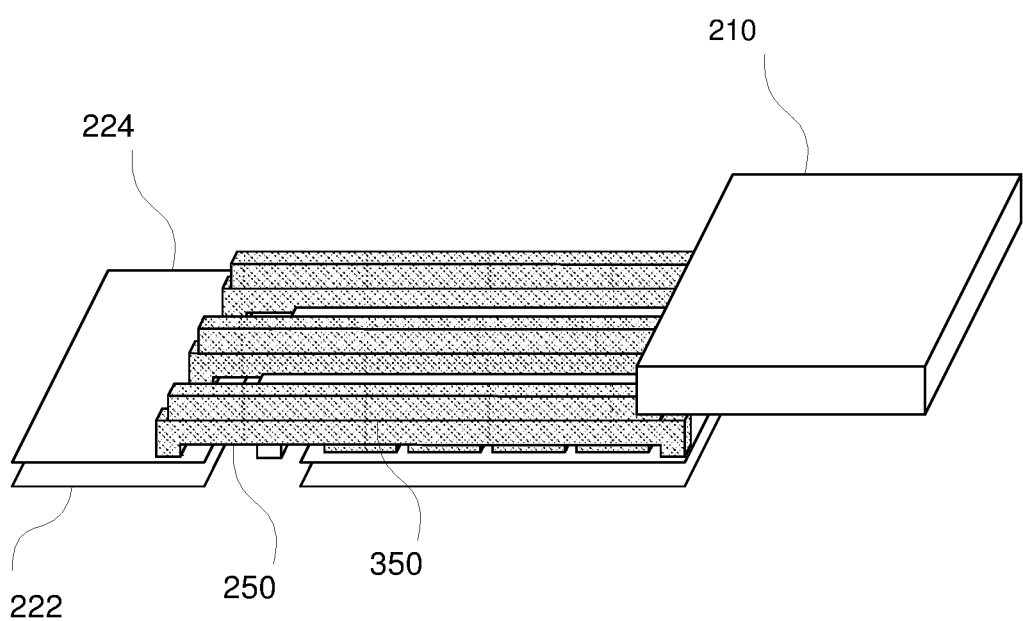
FIG. 3 illustrates a technique for reducing noise on signal traces in a substrate, in accordance with another embodiment.

FIG. 3 illustrates a technique for reducing noise on signal traces in a substrate 220, in accordance with another embodiment. The shield trace 250 of FIG. 2B is formed in the same redistribution layer as the first signal trace 226. Consequently, the metal layer thickness of the shield trace 250 and the first signal trace 226 will be approximately the same. This will decrease the effectiveness of the shielding because the EM field created around, e.g., the second signal trace 228 will reach over the middle shield trace 250 and induce some noise on the first signal trace 226 that is not canceled by currents induced in the shield trace 250. One technique to improve the effectiveness of the shield trace 250 is to increase the height of the shield trace 250 relative to the height of the signal traces being shielded.

As shown in FIG. 3, the height of the shield trace 250 may be increased by forming an extension 350 to shield trace 250 directly on top of the shield trace 250 in the redistribution layer. One technique for depositing the extension 350 is to deposit a layer of dielectric material of a particular thickness with a trench in the location of the extension. The signal trace 226 and shield trace 250 are then deposited on the dielectric layer such that conductive material of the shield trace 250 fills the trench open in the dielectric material. Depositing the extension 350 and the shield trace 250 in the same plating step couples the extension 350 and the shield trace 250 conductively and, essentially, forms a shield trace 250 that is twice as high as the shielded signal trace 226.

In another embodiment, the shield trace 250 and extension 350 may be formed using a semi-additive plating process. In such embodiments, a lithography process is utilized to grow the dielectric structure of the substrate 220, one layer at a time. For example, a polyimide film is deposited on the surface of the die and exposed similar to a photoresist. The polymide film is etched away to leave a structure of polyimide film that matches the structure of the conductive structures in the layer (e.g., vias, slot vias 254, shield trace 250, and extension 350). Each layer can be formed by successively applying a new polyimide film on the surface of the die 210/substrate 220, exposing the polyimide film, etching the film, and depositing more dielectric material in the negative space where the polyimide film has been etched away. The holes left in the substrate may then be filled using a plating process to fill the holes with a conductive material. It will be appreciated that any technically feasible technique for forming the substrate 220 on the die 210 may be utilized to fabricate the shield trace 250 and/or extension 350.

In another embodiment, a second ground plane may be deposited above the shield traces 250 and signal traces 226/228. The second ground plane may be connected to the extensions 350 by a plurality of additional slot vias 254, such that the signal traces 226/228 are nearly completely wrapped on all sides by conductive structures coupled to ground. This structure may further reduce coupling of the signal traces at the expense of an additional ground plane thickness in the substrate.

Figure 4A:
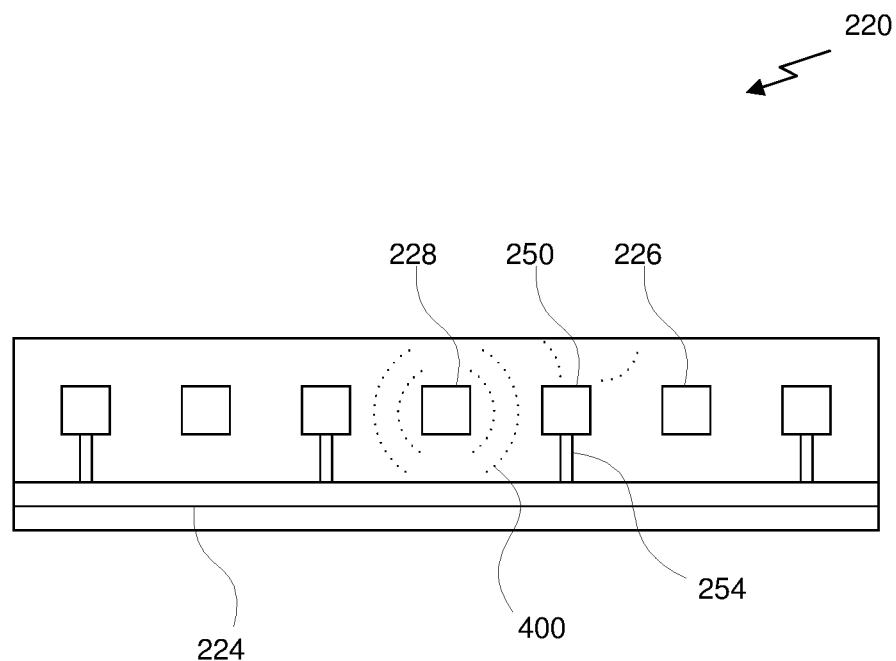
FIGS. 4A & 4B illustrate the EM field associated with signal traces in substrate, in accordance with one embodiment.
Figure 4B:
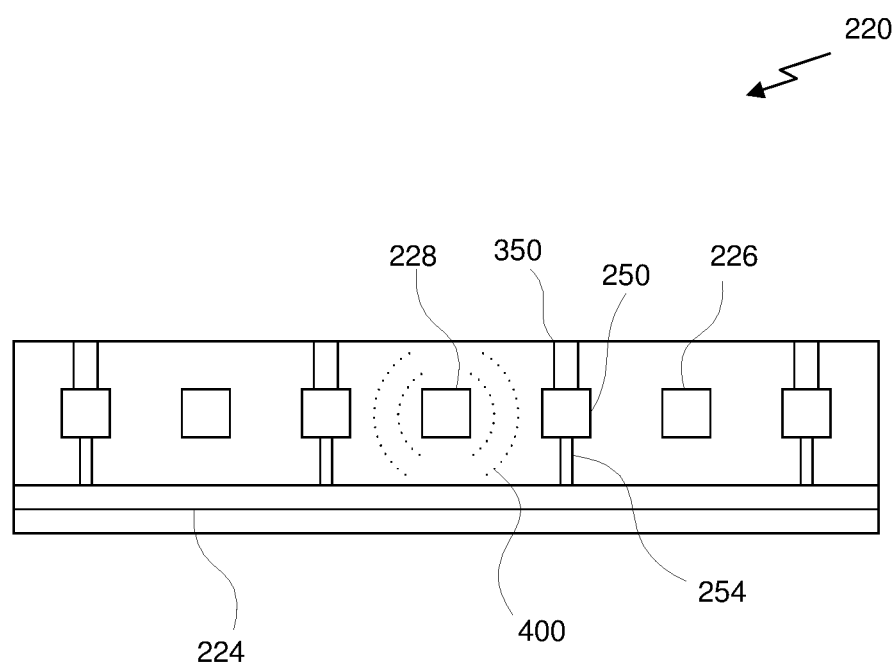

FIGS. 4A & 4B illustrate the EM field 400 associated with signal traces in substrate 220, in accordance with one embodiment. As shown in FIG. 4A, a plurality of signal traces (e.g., signal trace 226 and 228) are embedded within substrate 220. A plurality of shield traces 250 are also embedded within substrate 220 and coupled to a ground plane 224 via slot vias 254. The shield traces 250 and slot vias 254 reduce the strength of the EM field 400 associated with current in signal trace 228 at signal trace 226. Still, the signal trace 226 experiences some fluctuation of the EM field 400 due to the EM field not being completely canceled by the shield trace 250, or more accurately, the EM field associated with currents in signal trace 228 is not completely canceled by the EM field associated with currents induced in the shield trace 250. It will be appreciated that some EM field associated with the currents in the second signal trace 128 will jump over the top of shield trace 250 and be coupled to the first signal trace 126. As shown in FIG. 4B, the extension 350 to shield trace 250 is much more effective at reducing the strength of the EM field 400 at signal trace 226. In some simulations, EM field strength at signal trace 226 is reduced by more than 10 dB.

Figure 5A:
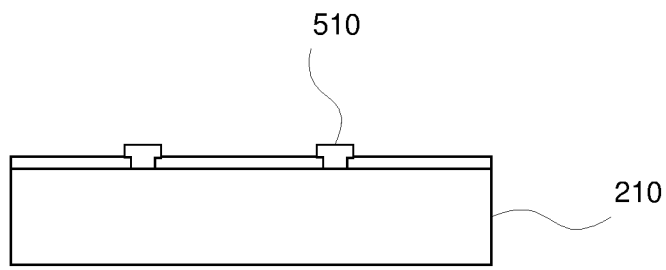
FIGS. 5A-5G illustrates a process flow for manufacturing an integrated circuit package that includes wafer fanout packaging technology, in accordance with one embodiment.
Figure 5B:
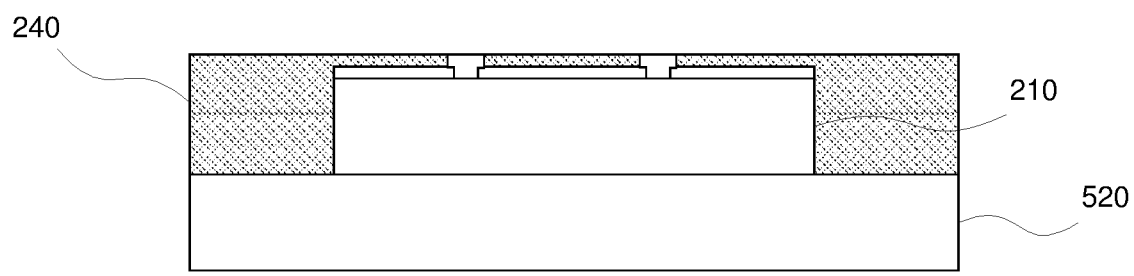

FIGS. 5A-5G illustrates a process flow for manufacturing an integrated circuit package that includes wafer fanout packaging technology, in accordance with one embodiment. As shown in FIG. 5A, a plurality of integrated circuit dies 210 are formed on a wafer. Bump sites 510 may be formed on the wafer using a semi-additive plating process. In one embodiment, each bump is formed by depositing a conductive material such as copper, copper alloy, or aluminum at the bump sites 510 on the die 210. As shown in FIG. 5B, the wafer may be diced to separate each of the individual dies 210 from the wafer, and each die 210 is mounted on a carrier 520. The die 210 may be encapsulated in a molding material 240 after being mounted on the carrier 520. The top surface of the encapsulated die may then be ground and/or polished to provide a flat surface for depositing the substrate 220 on the die 210. The carrier 520 provides a rigid base to hold the small integrated circuit dies during assembly of the substrate 220.

Figure 5C:
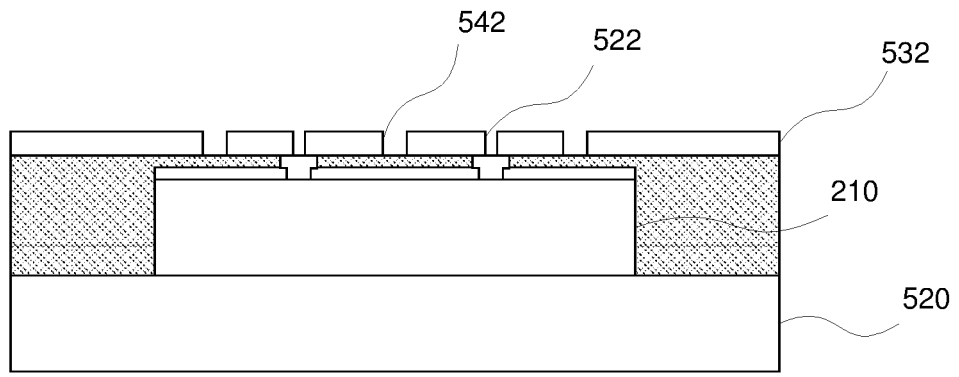

As shown in FIG. 5C, a first layer of dielectric material 532 is deposited on the top surface of the die 210. Holes 522 may be formed in the first layer of dielectric material 532 over the bump sites, while the first layer of dielectric material 532 is formed. In addition, one or more channels or trenches 542 are formed in the first layer of dielectric material 532. These trenches 542 will form the fence for electrical isolation. The via holes 522 and channels or trenches 542 can be formed through lithographic pattern exposure and development, polyimide, or PBO.

Figure 5D:
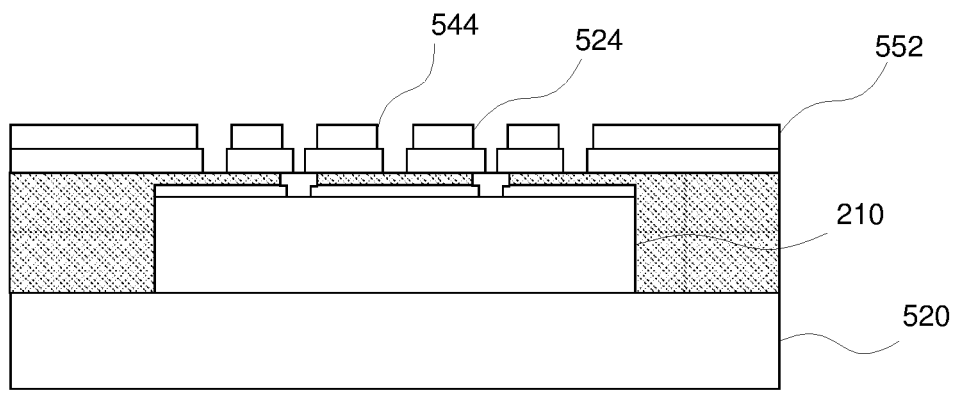

As shown in FIG. 5D, one redistribution layer (RDL) can be formed on top of the first layer of dielectric material 532 through a semi-additive plating process. For example, a seed layer such as TiCu or TiWCu can be deposited on top of the surface of the first layer of dielectric material 532. A photo resist layer 552 is then coated on the seed layer and followed by lithographic pattern and development to form trench 524/544 opens with resist. These trench 524/544 opens form the structure of the interconnects of the shield traces and signal traces of the RDL in the negative space of the photo resist layer 552. Copper traces can be formed inside via holes 522 and trenches 542, as well as trenches 524 and 544, which forms the signal traces coupled to bump sites on the die 210 as well as shield traces 250 with extensions 350 surrounding the signal traces. An electrical plating process will deposit a conductive material such as Cu inside the via holes 522, trenches 542 and the trench opens 524/544 in the photo resist layer 552.

Figure 5E:
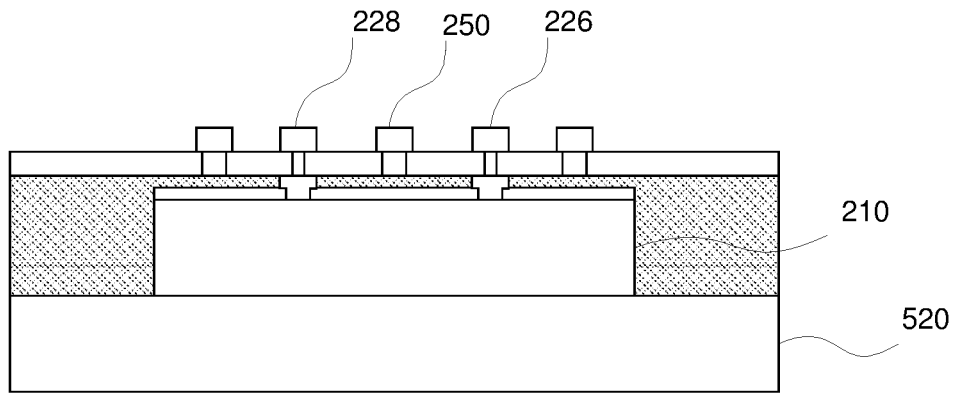

As shown in FIG. 5E, the photo resist layer 552 will be stripped away and followed by a seed etch process to remove conductive layers between the RDL and one or more additional RDLs. In one embodiment, the trenches 542 are narrower than the trenches 544 such that the extension 350 of the shield trace 250 is narrower than the width of a signal trace/shield trace in the RDL. Via holes 522 connect signal trace 226 or 228 to the die 210. Trenches 544 and 542, which are connected to form shield trace 250, will produce a taller copper trace than signal trace 226 or 228.

Figure 5F:
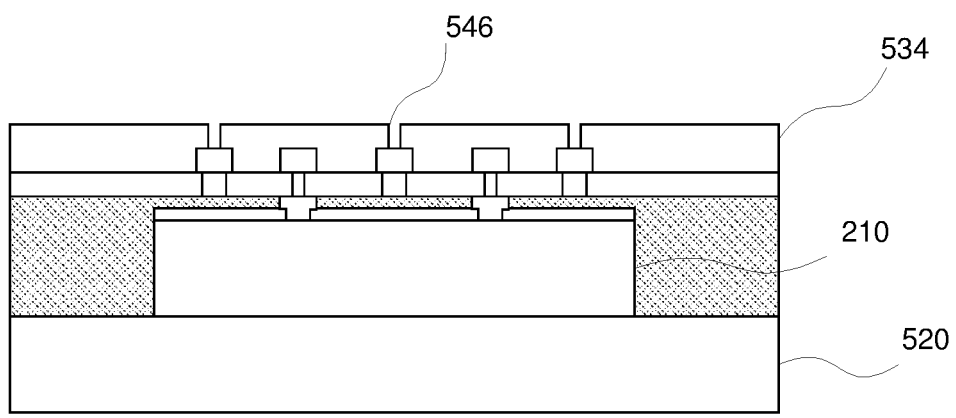

As shown in FIG. 5F, a second layer of dielectric material 534 is deposited on top of the first RDL including the signal traces/shield traces. A lithographic pattern and development process can produce via holes or trench via 546 opens in the second layer of dielectric material 534, which will provide the connection of slot vias 254 between the shield trace 250 and a ground plane after a plating process is used to fill the via holes and/or trench via opens in the second layer of dielectric material 534.

Figure 5G:
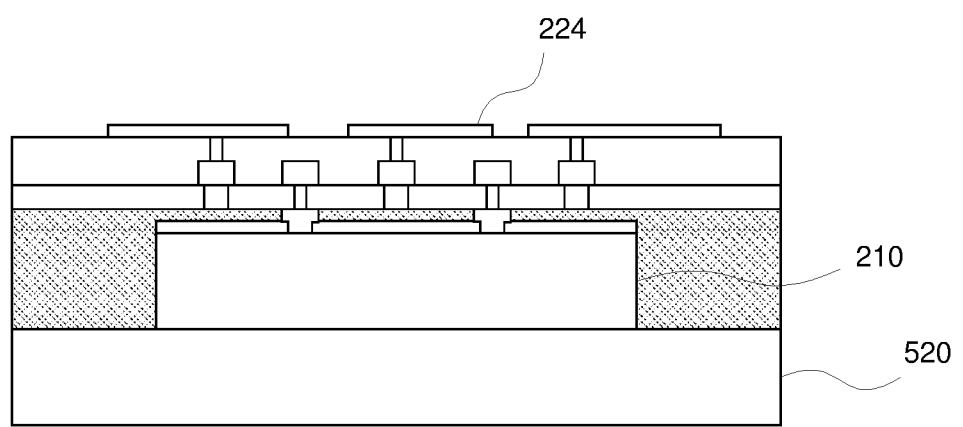

As shown in FIG. 5G, a layer of conductive material such as copper is deposited on the top of the die 210 to form a ground plane 224. In one embodiment, the ground plane 224 may be deposited during the same plating step as filling the slots 546. Although not shown explicitly, one or more additional layers of dielectric material, power planes 222, and/or additional redistribution layers may be deposited on top of the ground plane 224 to complete the substrate 220. The assembly can then be removed from the carrier 520, and a ball grid array or other mounting technology may be added to the substrate 220 to complete the package.

It will be appreciated that the exact order of steps used to create the conductive structures of the signal traces, shield traces, vias, slot vias, extension(s), and the like may be varied slightly. For example, a plating step can be implemented to fill holes created during deposition of the dielectric layer after each lithography step (i.e., deposition of polyimide film, exposure, etching, and deposition of dielectric material in the negative space between polyimide film) is completed. Alternatively, two or more lithography steps may be completed between plating steps.

Figure 6A:
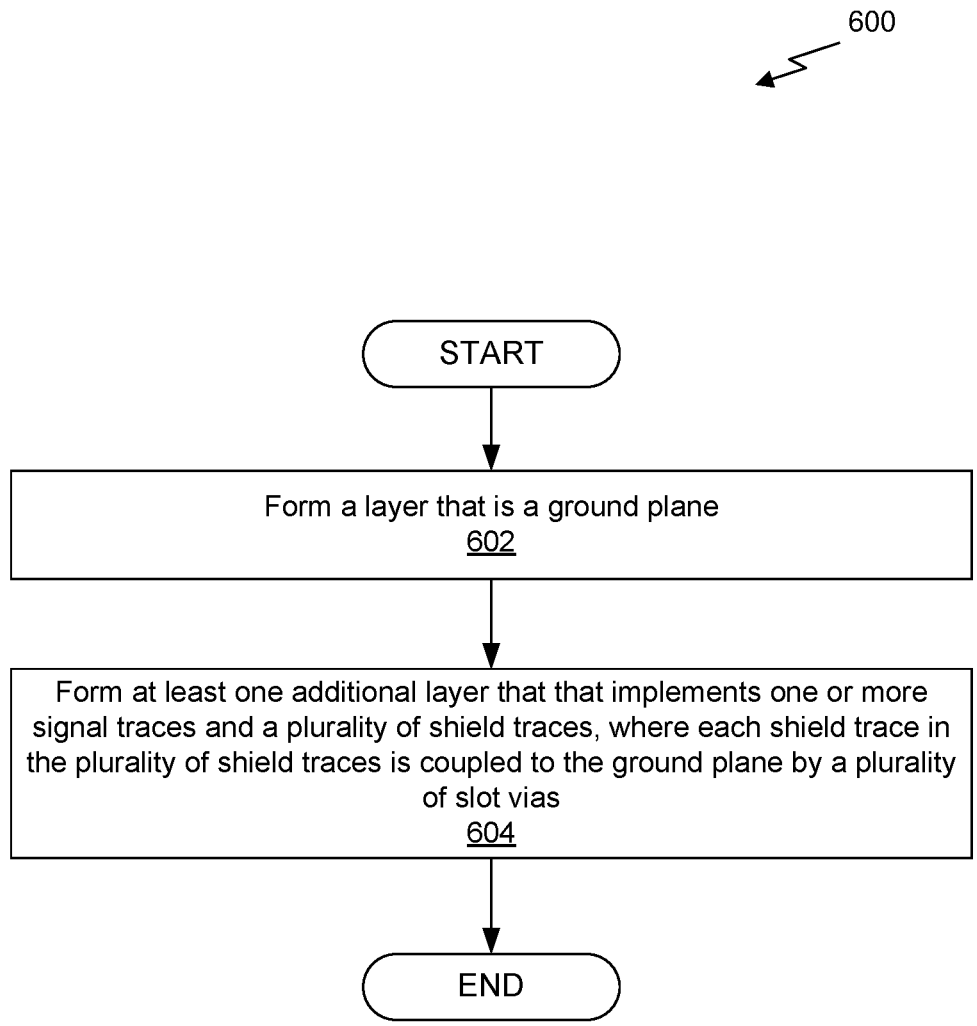
FIG. 6A is a flowchart of a method of manufacturing a substrate capable of being used in an integrated circuit package, in accordance with one embodiment.

FIG. 6A is a flowchart of a method 600 for manufacturing a substrate capable of being used in an integrated circuit package, in accordance with one embodiment. The method 600 may be performed by hardware, or a combination of hardware and software, on one or more specialized machines. Its should be noted that the definitions and description provided above may apply to the present embodiment.

In step 602, a layer is formed that is a ground plane. The ground plane is connected to a negative power supply voltage (e.g., $V_{SS}$).

In step 604, at least one additional layer is formed that implements one or more signal traces and a plurality of shield traces, where each shield trace in the plurality of shield traces is coupled to the ground plane by a plurality of slot vias. In one embodiment, each slot via comprises an array of microvias. Optionally, each microvia in the array of microvias is created by forming a hole in a dielectric material of the substrate and plating or filling the hole with a conductive material. As another option, each slot via is created by forming an elongated hole or trench open in a dielectric material of the substrate and plating or filling the elongated hole or trench open with a conductive material.

In another embodiment, each shield trace in the plurality of shield traces includes an interconnect and an extension in the substrate such that the height of the shield trace is larger than a height of a corresponding signal trace. In still yet another embodiment, each shield trace in the plurality of shield traces is coupled to a second ground plane of the substrate by a plurality of additional slot vias.

Figure 6B:
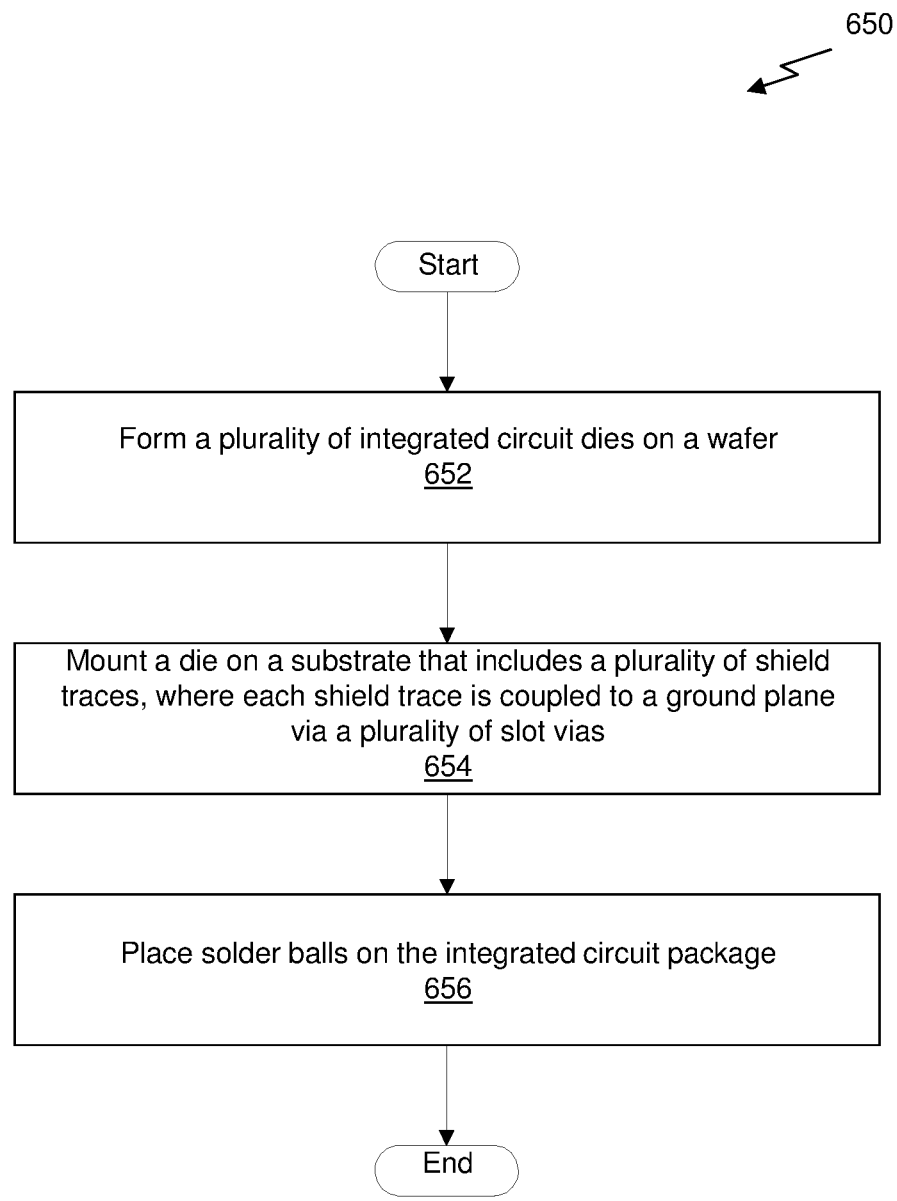
FIG. 6B is a flowchart of a method for assembling an integrated circuit package, in accordance with one embodiment.

FIG. 6B is a flowchart of a method 650 for assembling an integrated circuit package, in accordance with one embodiment. The method 650 may be performed by hardware, or a combination of hardware and software, on one or more specialized machines. In one embodiment, the method 650 is implemented, at least in part, by silicon wafer processing machinery and/or semi-additive plating process machinery.

At step 652, a plurality of integrated circuit dies are formed on a wafer. Each die includes a plurality of pads formed in the die and exposed on a top surface of the die. The pads are utilized to interface external signals with the logic implemented in the die. The wafer may be made by a variety of integrated circuit manufacturing techniques well-known in the art. Bump sites may be formed on the dies and the wafer may be diced to separate the individual dies from the wafer.

At step 654, the die is mounted on a substrate including a plurality of shield traces, where each shield trace is coupled to a ground plane of the substrate via a plurality of slot vias (e.g. as disclosed in FIG. 6A). In one embodiment, each slot via is formed by etching a slot in a dielectric layer of the substrate and then filling the slot with a conductive material. In another embodiment, each slot via is formed as an array of microvias. In one embodiment, the shield trace is extended in height utilizing an extension that is formed by depositing another layer of conductive material over the shield trace in a different layer of the substrate. The extension may be deposited directly on the shield trace or connected to the shield trace via additional slot vias. In another embodiment, an additional ground plane is deposited in the substrate and connected to the opposite side of the shield trace via additional slot vias such that a pair of shield traces and two ground planes wrap around a signal trace formed in the substrate.

At step 656, solder balls are placed on the IC package and/or one or more additional packages may be stacked on top of the IC package. The solder balls may be placed on the substrate. At least some of the solder balls may be placed on the IC package to form a ball grid array or other mounting interface for mounting the IC package to a printed circuit board.

Figure 7:
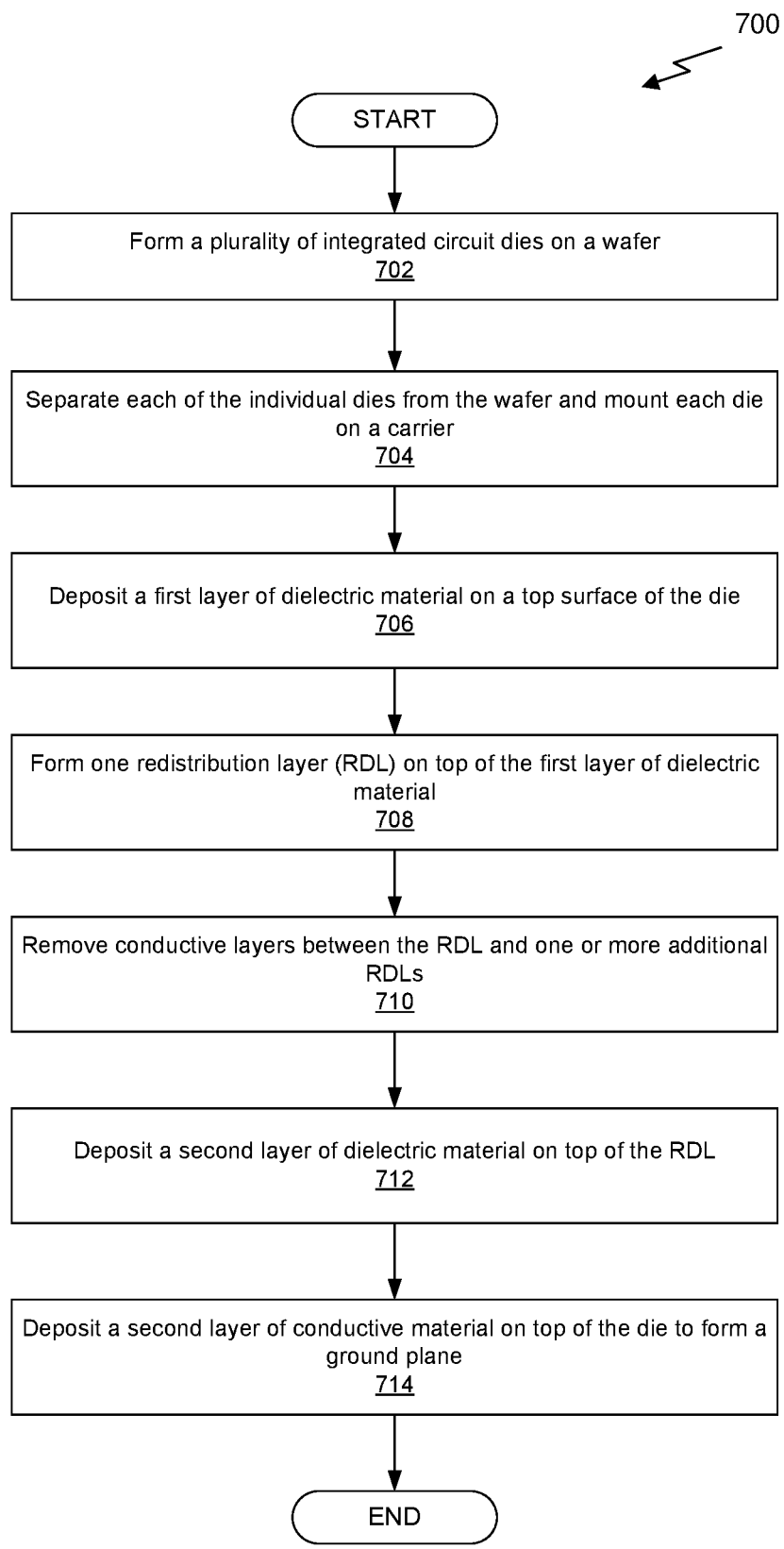
FIG. 7 illustrates a flowchart of a method for manufacturing an integrated circuit package that includes wafer fanout packaging technology, in accordance with one embodiment.

FIG. 7 illustrates a flowchart of a method 700 for manufacturing an integrated circuit package that includes wafer fanout packaging technology, in accordance with one embodiment. As referenced below, the method 700 may be performed in the context of the manufacturing process flow described above with respect to FIGS. 5A-5G. Further, the method 700 may be performed by hardware, or a combination of hardware and software, on one or more specialized machines. In one embodiment, the method 700 is implemented, at least in part, by silicon wafer processing machinery and/or semi-additive plating process machinery.

At step 702, a plurality of integrated circuit dies 210 are formed on a wafer (e.g. as shown in FIG. 5A). Bump sites 510 may be formed on the wafer using a semi-additive plating process. In one embodiment, each bump is formed by depositing a conductive material such as copper, copper alloy, or aluminum at the bump sites 510 on the die 210.

At step 704, each of the individual dies 210 is separated from the wafer (e.g. by dicing the wafer), and each die 210 is mounted on a carrier 520 (e.g. as shown in FIG. 5B). The die 210 may be encapsulated in a molding material 240 after being mounted on the carrier 520. The top surface of the encapsulated die may then be ground and/or polished to provide a flat surface for depositing the substrate 220 on the die 210. The carrier 520 provides a rigid base to hold the small integrated circuit dies during assembly of the substrate 220.

At step 706, a first layer of dielectric material 532 is deposited on the top surface of the die 210 (e.g. as shown in FIG. 5C). Holes 522 may be formed in the first layer of dielectric material 532 over the bump sites, while the first layer of dielectric material 532 is formed. In addition, one or more channels or trenches 542 are formed in the first layer of dielectric material 532. These trenches 542 will form the fence for electrical isolation. The via holes 522 and channels or trenches 542 can be formed through lithographic pattern exposure and development, polyimide, or PBO.

At step 708, one redistribution layer (RDL) can be formed on top of the first layer of dielectric material 532 through a semi-additive plating process (e.g. as shown in FIG. 5D). For example, a seed layer such as TiCu or TiWCu can be deposited on top of the surface of the first layer of dielectric material 532. A photo resist layer 552 is then coated on the seed layer and followed by lithographic pattern and development to form trench 524/544 opens with resist. These trench 524/544 opens form the structure of the interconnects of the shield traces and signal traces of the RDL in the negative space of the photo resist layer 552. Copper traces can be formed inside via holes 522 and trenches 542, as well as trenches 524 and 544, which forms the signal traces coupled to bump sites on the die 210 as well as shield traces 250 with extensions 350 surrounding the signal traces. An electrical plating process will deposit a conductive material such as Cu inside the via holes 522, trenches 542 and the trench opens 524/544 in the photo resist layer 552.

At step 710, the photo resist layer 552 will be stripped away and followed by a seed etch process to remove conductive layers between the RDL and one or more additional RDLs (e.g. as shown in FIG. 5E). In one embodiment, the trenches 542 are narrower than the trenches 544 such that the extension 350 of the shield trace 250 is narrower than the width of a signal trace/shield trace in the RDL. Via holes 522 connect signal trace 226 or 228 to the die 210. Trenches 544 and 542, which are connected to form shield trace 250, will produce a taller copper trace than signal trace 226 or 228.

At step 712, a second layer of dielectric material 534 is deposited on top of the RDL including the signal traces/shield traces (e.g. as shown in FIG. 5F). A lithographic pattern and development process can produce via holes or trench via 546 opens in the second layer of dielectric material 534, which will provide the connection of slot vias 254 between the shield trace 250 and a ground plane after a plating process is used to fill the via holes and/or trench via opens in the second layer of dielectric material 534.

At step 714, a layer of conductive material such as copper is deposited on the top of the die 210 to form a ground plane 224 (e.g. as shown in FIG. 5G). In one embodiment, the ground plane 224 may be deposited during the same plating step as filling the slots 546. Although not shown explicitly, one or more additional layers of dielectric material, power planes 222, and/or additional redistribution layers may be deposited on top of the ground plane 224 to complete the substrate 220. The assembly can then be removed from the carrier 520, and a ball grid array or other mounting technology may be added to the substrate 220 to complete the package.

It will be appreciated that the exact order of steps used to create the conductive structures of the signal traces, shield traces, vias, slot vias, extension(s), and the like may be varied slightly. For example, a plating step can be implemented to fill holes created during deposition of the dielectric layer after each lithography step (i.e., deposition of polyimide film, exposure, etching, and deposition of dielectric material in the negative space between polyimide film) is completed. Alternatively, two or more lithography steps may be completed between plating steps.

It is noted that the techniques described herein, in an aspect, are embodied in executable instructions stored in a computer readable medium for use by or in connection with an instruction execution machine, apparatus, or device, such as a computer-based or processor-containing machine, apparatus, or device. It will be appreciated by those skilled in the art that for some embodiments, other types of computer readable media are included which may store data that is accessible by a computer, such as magnetic cassettes, flash memory cards, digital video disks, Bernoulli cartridges, random access memory (RAM), read-only memory (ROM), and the like.

As used here, a "computer-readable medium" includes one or more of any suitable media for storing the executable instructions of a computer program such that the instruction execution machine, system, apparatus, or device may read (or fetch) the instructions from the computer readable medium and execute the instructions for carrying out the described methods. Suitable storage formats include one or more of an electronic, magnetic, optical, and electromagnetic format. A non-exhaustive list of conventional exemplary computer readable medium includes: a portable computer diskette; a RAM; a ROM; an erasable programmable read only memory (EPROM or flash memory); optical storage devices, including a portable compact disc (CD), a portable digital video disc (DVD), a high definition DVD (HD-DVD™), a BLU-RAY disc; and the like.

It should be understood that the arrangement of components illustrated in the Figures described are exemplary and that other arrangements are possible. It should also be understood that the various system components (and means) defined by the claims, described below, and illustrated in the various block diagrams represent logical components in some systems configured according to the subject matter disclosed herein.

For example, one or more of these system components (and means) may be realized, in whole or in part, by at least some of the components illustrated in the arrangements illustrated in the described Figures. In addition, while at least one of these components are implemented at least partially as an electronic hardware component, and therefore constitutes a machine, the other components may be implemented in software that when included in an execution environment constitutes a machine, hardware, or a combination of software and hardware.

More particularly, at least one component defined by the claims is implemented at least partially as an electronic hardware component, such as an instruction execution machine (e.g., a processor-based or processor-containing machine) and/or as specialized circuits or circuitry (e.g., discreet logic gates interconnected to perform a specialized function). Other components may be implemented in software, hardware, or a combination of software and hardware. Moreover, some or all of these other components may be combined, some may be omitted altogether, and additional components may be added while still achieving the functionality described herein. Thus, the subject matter described herein may be embodied in many different variations, and all such variations are contemplated to be within the scope of what is claimed.

In the description above, the subject matter is described with reference to acts and symbolic representations of operations that are performed by one or more devices, unless indicated otherwise. As such, it will be understood that such acts and operations, which are at times referred to as being computer-executed, include the manipulation by the processor of data in a structured form. This manipulation transforms the data or maintains it at locations in the memory system of the computer, which reconfigures or otherwise alters the operation of the device in a manner well understood by those skilled in the art. The data is maintained at physical locations of the memory as data structures that have particular properties defined by the format of the data. However, while the subject matter is being described in the foregoing context, it is not meant to be limiting as those of skill in the art will appreciate that various acts and operations described hereinafter may also be implemented in hardware.

To facilitate an understanding of the subject matter described herein, many aspects are described in terms of sequences of actions. At least one of these aspects defined by the claims is performed by an electronic hardware component. For example, it will be recognized that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the embodiments as claimed.

The embodiments described herein include the one or more modes known to the inventor for carrying out the claimed subject matter. It is to be appreciated that variations of those embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:
1. An integrated circuit (IC) package, comprising:
a die that includes a plurality of bump sites; and
a substrate connected to the die at the plurality of bump sites, the substrate including at least one layer that implements both one or more signal traces and a plurality of shield traces, wherein each shield trace in the plurality of shield traces is coupled to a ground plane by a plurality of slot vias, each of the plurality of slot vias positioned along a length of each shield trace in the substrate and one or more of the signal traces is interposed between at least two of the plurality of shield traces in the at least one layer, each slot via comprising an elongated hole axially parallel to the length of the shield trace.

2. The IC package of claim 1, wherein each slot via comprises an array of microvias.

3. The IC package of claim 2, wherein each microvia in the array of microvias comprises a hole formed in a dielectric material of the substrate and plated or filled conductive material in the hole.

4. The IC package of claim 3, wherein the hole is formed using a laser drilling technique.

5. The IC package of claim 1, wherein each slot via is formed in a dielectric material of the substrate and is plated or filled with conductive material.

6. The IC package of claim 5, wherein the elongated hole or a trench is formed using at least one of laser etching, laser chemical etching, plasma etching, metal assisted chemical etching, or a lithography defined polyimide or PBO (Polybenzoazole) pattern.

7. The IC package of claim 1, wherein each shield trace in the plurality of shield traces includes an interconnect and an extension in the substrate such that a height of the shield trace is larger than a height of a corresponding signal trace.

8. The IC package of claim 7, wherein the interconnect is wider than the extension.

9. The IC package of claim 1, wherein each shield trace in the plurality of shield traces is coupled to a second ground plane by a plurality of additional slot vias.

10. The IC package of claim 1 wherein the length of the shield trace is defined by a first end and a second end, and further including an end via positioned at at least one of the first end or the second end, the plurality of slot vias being formed between the first end and the second end.

11. A system, comprising:
an integrated circuit (IC) package including:
a die that includes a plurality of bump sites; and
a substrate connected to the die at the plurality of bump sites, the substrate including at least one layer that implements one or more signal traces and a plurality of shield traces, wherein each shield trace in the plurality of shield traces is coupled to a ground plane by a plurality of slot vias, each of the plurality of slot vias positioned along a length of each shield trace in the substrate, each slot via comprising an elongated hole axially parallel to the length of the shield trace, and one or more of the signal traces is interposed between ones of the plurality of shield traces in the at least one layer.

12. The system of claim 11, wherein each slot via comprises an array of microvias.

13. The system of claim 12, wherein each microvia in the array of microvias comprises a hole in a dielectric material of the substrate that is plated or filled with a conductive material.

14. The system of claim 11, wherein each slot via is created by forming an elongated hole or a trench open in a dielectric material of the substrate that is plated or filled with conductive material in the elongated hole or trench.

15. The system of claim 11, wherein each shield trace in the plurality of shield traces includes an interconnect and an extension in the substrate such that a height of the shield trace is larger than a height of a corresponding signal trace.

16. The system of claim 11, wherein each shield trace in the plurality of shield traces is coupled to a second ground plane by a plurality of additional slot vias.

17. The system of claim 11, the system further including a printed circuit board, wherein the IC package is mounted to the printed circuit board.

18. An integrated circuit (IC) package, comprising:
a die that includes a plurality of bump sites; and
a substrate connected to the die at the plurality of bump sites, the substrate including at least one layer that implements both one or more signal traces and a plurality of shield traces, wherein each shield trace in the plurality of shield traces is coupled to a ground plane by a plurality of slot vias, and one or more of the signal traces is interposed between at least two of the plurality of shield traces in the at least one layer, each slot via comprising an elongated hole axially parallel to a length of the shield trace, wherein the length of the shield trace is defined by a first end and a second end, and further including an end via positioned at at least one of the first end or the second end, the plurality of slot vias formed between the first end and the second end.

19. The package of claim 18, wherein each slot via comprises an array of microvias.

20. The system of claim 19, wherein each microvia in the array of microvias comprises a hole in a dielectric material of the substrate that is plated or filled with a conductive material.

\* \* \* \* \*